(12) United States Patent
Cai et al.

(10) Patent No.: US 7,076,130 B2
(45) Date of Patent: Jul. 11, 2006

(54) SEMICONDUCTOR OPTICAL DEVICE HAVING ASYMMETRIC RIDGE WAVEGUIDE AND METHOD OF MAKING SAME

(75) Inventors: Li Cai, Fayetteville, AR (US); James M. VanHove, Superior, CO (US); Mark McElhinney, Oro Valley, AZ (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 114 days.

(21) Appl. No.: 10/657,807

(22) Filed: Sep. 8, 2003

(65) Prior Publication Data

US 2004/0155254 A1 Aug. 12, 2004

Related U.S. Application Data

(60) Provisional application No. 60/409,730, filed on Sep. 11, 2002.

(51) Int. Cl.
*G02B 6/26* (2006.01)
(52) U.S. Cl. ..................... 385/31; 372/43.01

(58) Field of Classification Search ................ 385/31, 385/1–10, 37, 88, 129–132; 372/43, 46
See application file for complete search history.

(56) References Cited

U.S. PATENT DOCUMENTS

| | | | |
|---|---|---|---|
| 5,563,902 A | | 10/1996 | Xu et al. |
| 5,673,129 A | * | 9/1997 | Mizrahi .................. 398/95 |
| 5,993,073 A | * | 11/1999 | Hamakawa et al. ........ 385/88 |
| 6,430,204 B1 | * | 8/2002 | Tanaka ................. 372/46.01 |
| 2002/0001325 A1 | * | 1/2002 | Igarashi ................... 372/43 |
| 2003/0128729 A1 | * | 7/2003 | Matsumura ............... 372/46 |
| 2004/0047381 A1 | * | 3/2004 | Tojo et al. ................. 372/46 |
| 2004/0101986 A1 | * | 5/2004 | Kozaki et al. ............. 438/22 |
| 2004/0201031 A1 | * | 10/2004 | Yamasaki et al. ......... 257/103 |

\* cited by examiner

*Primary Examiner*—Sung Pak
(74) *Attorney, Agent, or Firm*—Carlson, Caspers, Vandenburgh & Lindquist

(57) ABSTRACT

In order to reduce the possibility of a laser operating in multiple transverse modes at high power, the laser is provided with laterally asymmetric losses that discriminate against modes higher than the fundamental mode. One approach to doing this is form an asymmetric ridge waveguide in the laser, that allows the light of the higher order modes to leak out of the waveguide.

33 Claims, 6 Drawing Sheets

SEMICONDUCTOR OPTICAL DEVICE HAVING ASYMMETRIC RIDGE WAVEGUIDE AND METHOD OF MAKING SAME

This claims benefit of 60/409,730 filed Sep. 11, 2002.

FIELD OF THE INVENTION

The present invention is directed generally to a semiconductor device, and more particularly to a semiconductor device with an asymmetric ridge waveguide.

BACKGROUND

Optical fiber communications have been a commercial reality now for over twenty years. Research and development efforts still continue to explore new laser sources, new forms of optical amplifiers, novel materials for low-loss optical fibers, and the like. At present, long-haul fiber optic communication systems employ small core (on the order of a few microns) single-mode fibers used in conjunction with laser diodes also operating in their single-mode regime, typically the lowest order transverse mode. This configuration yields low intermodal dispersion and allows for what is commonly called dense wavelength multiplexing (DWDM).

Today, low-loss single mode fibers and laser diodes that operate near optimum wavelength for low loss propagation are readily available. Even so, in-line optical amplifiers (all-optical repeaters) are necessary approximately every 400 kilometers ($\cong$250 miles) or so for long haul applications. One such in-line optical booster is the erbium-doped fiber amplifier. This device is capable of simultaneously amplifying multiple wavelengths (multiple optical channels) by optically pumping from a secondary pump laser operating at a shorter wavelength. Notwithstanding these advances, research is still underway to increase the distance between optical repeaters. One approach is to increase the optical energy from the pump laser coupled into the fiber. Practical challenges arise from this approach. First, laser diodes driven at high input currents may transition from single-mode to multimode operation, indicative of the so-called "kink effect" in the light output versus injection current characteristic. Although the laser may have more total output optical energy in the multi-mode state, there are at least two negative drawbacks to this straightforward approach. First, when lasing in the multi-mode regime, the optical energy is less confined near the optical axis of the laser and more divergent as the beam exits the laser endface. Given this, the coupling efficiency for focusing the laser output into a fiber is reduced. Secondly, the multi-mode operation of the laser may increase the intermodal dispersion in the fiber so as to decrease the available bandwidth for multichannel operation.

Given the above, there is a need for a technique to operate laser diodes at increased optical output levels while constraining the laser to continue to operate in the single-mode regime.

SUMMARY OF THE INVENTION

An approach followed in the present invention to overcome the problem of the "kink effect" is to provide a laser having laterally asymmetric losses that discriminate against modes higher than the fundamental mode.

One embodiment of the invention is directed to a semiconductor optical device that has a substrate and first and second semiconductor side regions formed over the substrate. The height of the first side region above the substrate is different from a height of the second side region above the substrate. A semiconductor ridge is disposed between the first and second side regions and over the substrate forming an optical waveguide within the device. The height of the semiconductor ridge above the substrate is greater than the heights of the first and second side regions above the substrate.

Another embodiment of the invention is directed to an optical communications system that has an optical transmitter, a fiber optic link coupled to receive optical signals from the optical transmitter, and an optical receiver coupled to the fiber optic link to receive the optical signals. A laser is coupled to inject light into the fiber optic link. The laser includes a substrate having first and second semiconductor side regions formed over the substrate. The height of the first side region above the substrate is different from the height of the second side region above the substrate. A semiconductor ridge is formed between the first and second side regions and over the substrate to introduce an optical waveguide within the device. The height of the semiconductor ridge above the substrate is greater than the heights of the first and second side regions above the substrate.

Another embodiment of the invention is directed to a semiconductor laser that has a substrate having an upper surface. A lateral direction is defined parallel to the upper substrate surface. One or more superstrate layers are provided on the substrate. An optical waveguide is disposed over the substrate to guide light passing between ends of the substrate and defining a fundamental optical mode. First and second sides of the optical waveguide provide optical confinement in the lateral direction. The optical confinement for the fundamental optical mode provided on the first side of the optical waveguide is different from the optical confinement provided on the second side of the optical waveguide.

Another embodiment of the invention is directed to an optical communications system that has an optical transmitter, a fiber optic link coupled to receive optical signals from the optical transmitter, and an optical receiver coupled to the fiber optic link to receive the optical signals. A laser is coupled to inject light into the fiber optic link. The laser includes a substrate and one or more superstrate layers provided on the substrate. An optical waveguide is disposed over the substrate to guide light passing between ends of the substrate. The waveguide defines a fundamental optical mode. First and second sides of the optical waveguide providing optical confinement in the lateral direction. The optical confinement for the fundamental optical mode provided on the first side of the optical waveguide is different from the optical confinement provided on the second side of the optical waveguide.

Another embodiment of the invention is directed to a method of forming a semiconductor device having an asymmetric ridge. The method includes removing material on a first side of a ridge region to a first depth, and removing material on a second side of the ridge region to a second depth different from the first depth, so as to produce the asymmetric ridge in the ridge region.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
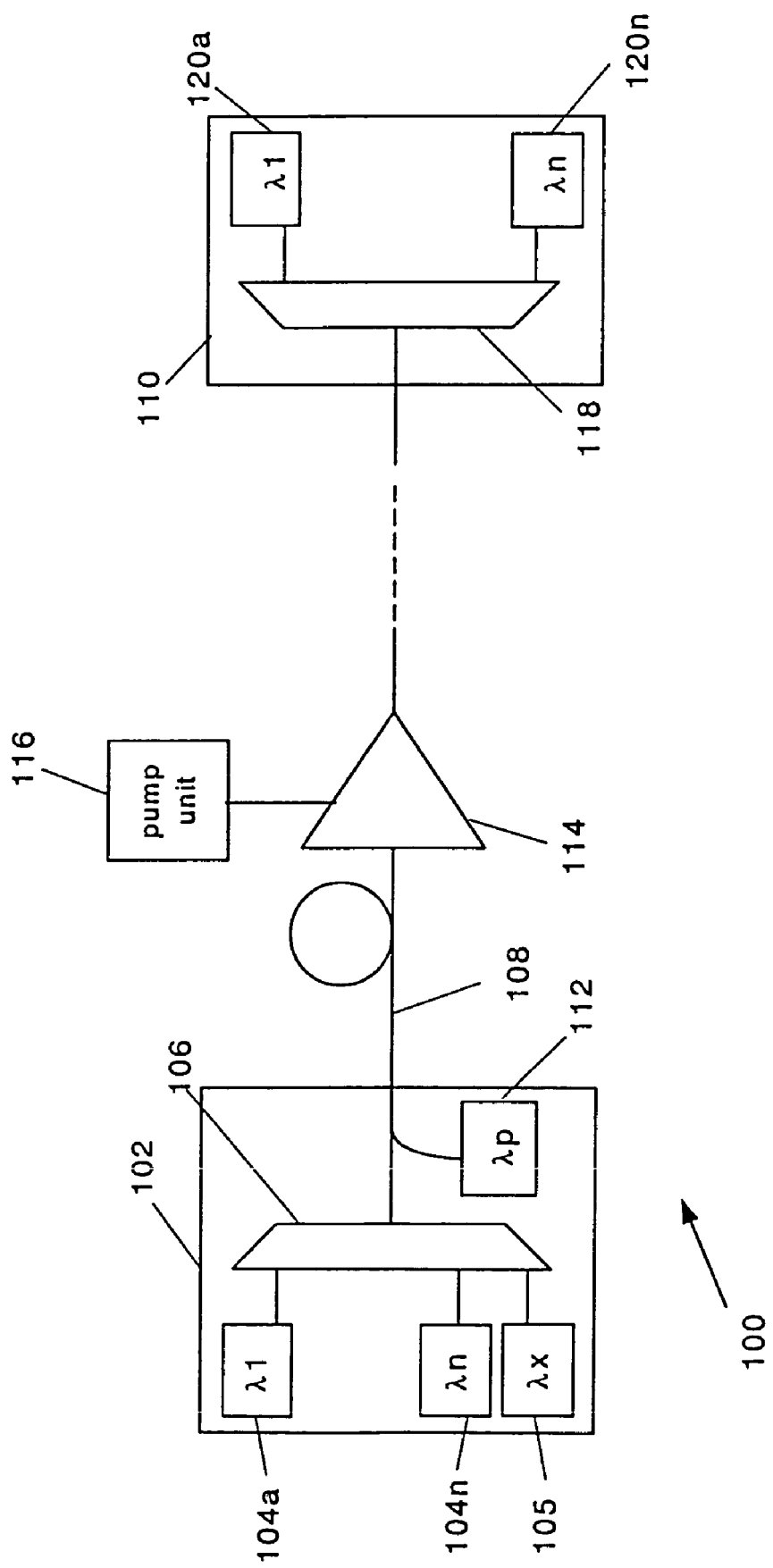
FIG. 1 schematically illustrates an optical communications system that includes a laser according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

In general, the present invention is directed to a semiconductor device that has an asymmetric ridge waveguide. In particular, the material on one side of the ridge is at a different height from the material on the other side of the ridge. A laser formed with an asymmetric waveguide has improved wave-guiding properties in that there is less lateral confinement for higher order modes above the fundamental mode. As a result, the threshold for a higher order mode is higher than in a laser having an equivalent symmetrical ridge, and so the power level at which the output from the laser changes from being single transverse mode to including a higher order transverse mode is increased. Accordingly, the "kink power", the power at which the kink occurs in the L-I curve of the laser, is higher, and the laser may be used to operate in a single transverse mode at higher power levels. One of the advantages of higher power operation with a single transverse mode is in pumping fiber devices, such as fiber amplifiers or fiber lasers. The occurrence of the kink is usually accompanied with a reduction in the coupling efficiency into the fiber because the higher order mode is less focusable than the fundamental transverse mode. The increase in the kink power, therefore, permits increased amounts of light to be coupled into the fiber device with high efficiency.

A laser having an asymmetric waveguide according to the present invention may be employed in a DWDM communications system 100, schematically illustrated in FIG. 1. The system 100 includes a dense wavelength multiplexed (DWDM) transmitter unit 102 that includes a number of lasers 104a–104n operating at different wavelengths, $\lambda 1$–$\lambda n$. In addition, one or more spare lasers 105 may operate as a substitute if any of the lasers 104a–104n fail. The lasers 104a–104n and 105 may each include modulators for modulating information onto the respective output light beams. The outputs from the lasers 104a–104n, 105 may be combined in a DWDM combiner arrangement 106 and launched as a DWDM signal into an optical fiber communications link 108 that is coupled to a DWDM receiver 110.

The transmitter 102 may also include a pump laser unit 112 for transmitting pump light into the fiber link 108. For example, the pump laser unit 112 may produce pump light having a wavelength, $\lambda p$, that pumps a fiber amplifier. In one embodiment, the pump laser unit 112 generates light at a wavelength that provides Raman gain for the DWDM signal. The pump light and the DWDM signal may both be injected in to the fiber link 108 from the transmitter 102, with the result that the DWDM signal is amplified in the initial portion of the fiber link leaving the transmitter.

The fiber link 108 may include one or more fiber amplifier units 114 to amplify the DWDM signal as it propagates to the DWDM receiver 110. An amplifier unit 114 typically includes a length of fiber that provides gain to the DWDM signal and one or more pump lasers in a pump laser unit 116. The gain fiber may be, for example a rare earth-doped fiber, such as an erbium-doped fiber amplifier (EDFA), or may be a Raman fiber amplifier (RFA). The pump lasers in the pump laser unit 116 provide pump light at a wavelength appropriate for pumping the fiber amplifier. Where the fiber amplifier is an EDFA, the pump light may have a wavelength of around 980 nm. Where the fiber amplifier is a RFA, the pump light may have a wavelength different from the wavelength of the DWDM signal by an amount equal to the Raman Stokes shift.

Other elements, such as isolators, switches, add/drop multiplexers and the like may also be disposed along the fiber link 108. The DWDM receiver 110 demultiplexes the received DWDM signal in a demultiplexer 118 and directs signals at different wavelengths $\lambda 1$–$\lambda n$ to respective channel detectors 120a–120n.

Figure 2:
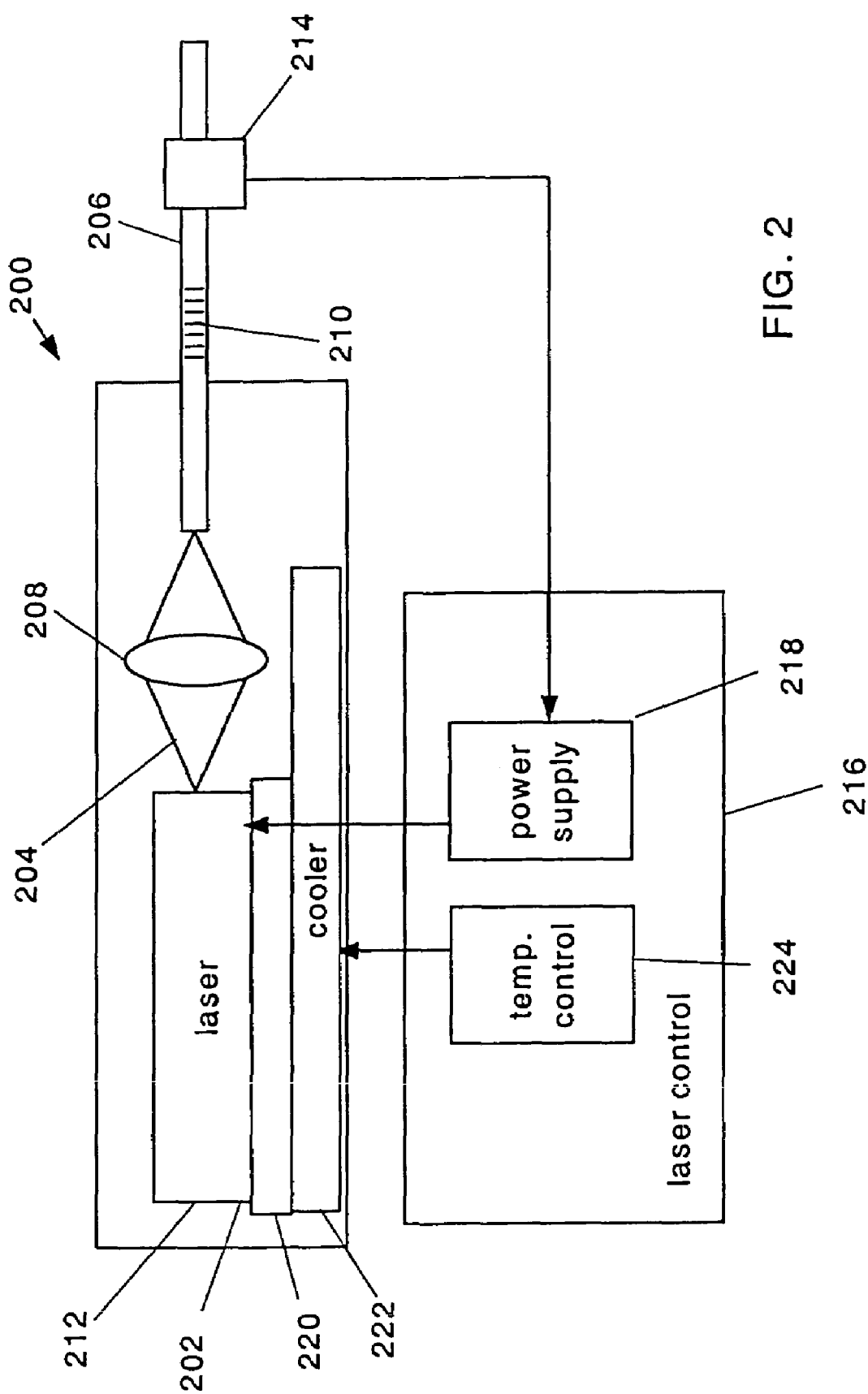
FIG. 2 is a block schematic diagram illustrating a frequency selected laser unit according to the present invention.

A block schematic diagram showing various elements of a pump laser unit 200 that uses a laser according to an embodiment of the present invention is illustrated in FIG. 2. A laser 202 generates an output light beam 204 that is coupled to a fiber 206, typically using a lens system 208 having one or more lenses. The fiber 206 may include a fiber Bragg grating (FBG) 210 that provides feedback to the laser 202 at the selected pump wavelength, $\lambda p$. This helps to maintain the output wavelength of the laser 202 at the desired pump wavelength, $\lambda p$. The output wavelength of the laser may be selected using another technique. In some embodiments, a grating such as a distributed Bragg grating may be integrated with the laser 202, or a FBG or other frequency selective element may be provided at the rear end 212 of the laser 202 to provide frequency selective feedback, thus stabilizing the wavelength of the light 204 output from the laser.

The laser 202 may be any suitable type of semiconductor laser that produces an output at a desired wavelength. For example, to produce output at around 980 nm for pumping an EDFA, the laser 202 may use an InGaAs quantum well active region grown over a GaAs substrate. To produce an output in the range 1400 nm –1500 nm for providing Raman gain, the laser 202 may use an InGaAsP quantum well active region formed over an InP substrate.

A monitor 214, for example a tap monitor, may be used to monitor the output power from the laser 202. The monitor may be positioned to measure a portion of the laser output, as illustrated, or may be positioned at the back of the laser 202 to measure the power leaking out of the rear end 212. A controller 216 includes the power supply 218 for providing power to the laser 202. The power supply 218 may be coupled to receive a power signal from the tap monitor 214, and may regulate the amount of current directed to the laser so as to maintain a constant output power.

The laser 202 is typically mounted on a submount 220 that is thermally coupled to a cooling unit 222 that removes excess heat from the laser 202. The cooling unit 222 may be an active cooler, such as a thermoelectric cooler. Where the cooling unit 222 is an active cooler, the controller 216 may include a cooler control unit 224 coupled to control operation of the cooling unit 222.

Figure 3:
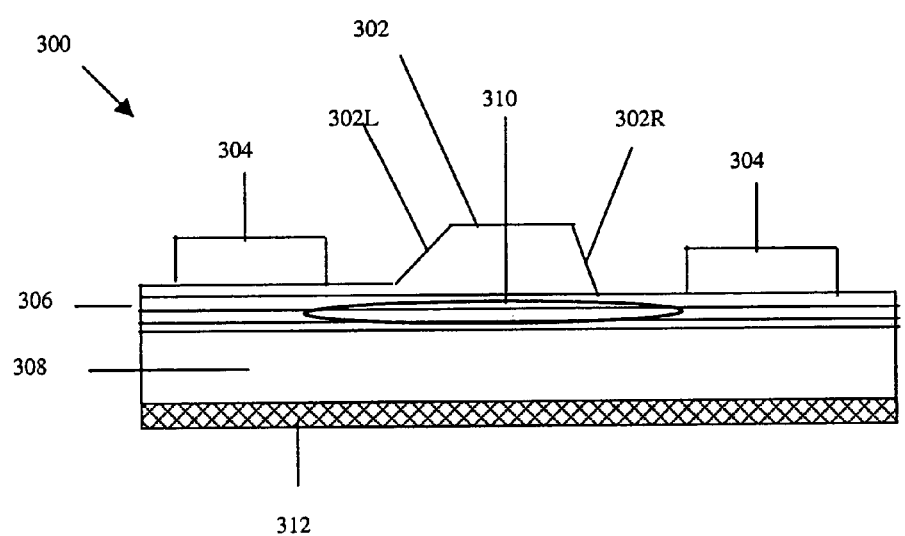
FIG. 3 illustrates a semiconductor laser with an asymmetric ridge waveguide according to the present invention.

FIG. 3 illustrates an end-on view of a semiconductor laser diode 300 with an asymmetric ridge waveguide 302. The asymmetric ridge waveguide 302 is shown with a left-hand side of the ridge 302L, having a different height from that of the right-hand side of the ridge 302R. Bonding pads 304 are typically situated on either side of the asymmetric ridge waveguide 302 for making electrical contact to the laser diode 300. The laser diode 300 is formed from a number of superstrate layers 306 formed over a substrate 308. The bottom surface of the substrate 308 typically has a metallization layer 312 for soldering to submount assemblies. The superstrate layers 306 include an active layer 310, which may be a quantum well active layer. The superstrate layers 306 may also include layers that, in tandem with the asymmetric ridge waveguide 302, provide optical confinement of laser light within the laser diode 300 in the vertical and/or horizontal direction.

The right-hand side of the ridge 302R may be further in depth into the superstrate 306 and may therefore be closer in proximity to the active region 310 than the left-hand side of the ridge 302L. The slopes of the ridge surfaces 302L and 302R may be the same, or the slope of the right-hand side ridge 302R may be different from the slope of the left-hand side ridge 302L. In this case, the right-hand side ridge 302R may be sufficiently close to the active region 310 so as to generate tight lateral confinement/waveguiding. In contrast, the left-hand side ridge 302L may be sufficiently far removed from the active region 310 so that the waveguide provides weak lateral confinement of higher order modes, while still efficiently guiding the fundamental mode. The net result of this asymmetric configuration, with stronger confinement on one side of the waveguide relative to the other side, may result in the waveguide being less efficient in guiding higher order modes than the fundamental lowest order mode of the waveguide, which leads to an increase in the threshold condition for lasing action for the higher order modes. This may allow the laser 300 to be operated at higher single-mode power levels before the so-called "kink effect," indicative of the higher order modes reaching threshold, becomes apparent.

Similar results may be obtained if the ridge geometry were reversed, for example, the left-hand ridge 302L may be sufficiently close to the active region 310 to provide tight lateral confinement and the right-hand ridge 302R may be sufficiently far removed to yield weak lateral confinement of the higher order modes.

Asymmetric ridge waveguides may be fabricated by a technique which includes two (or more) optical masks and multiple masking steps for the left and right-hand ridge regions. Fabrication of asymmetric ridge waveguides utilizing this technique may require difficult mask-to-mask alignment accuracies on the order of a micron or less.

Figure 4:
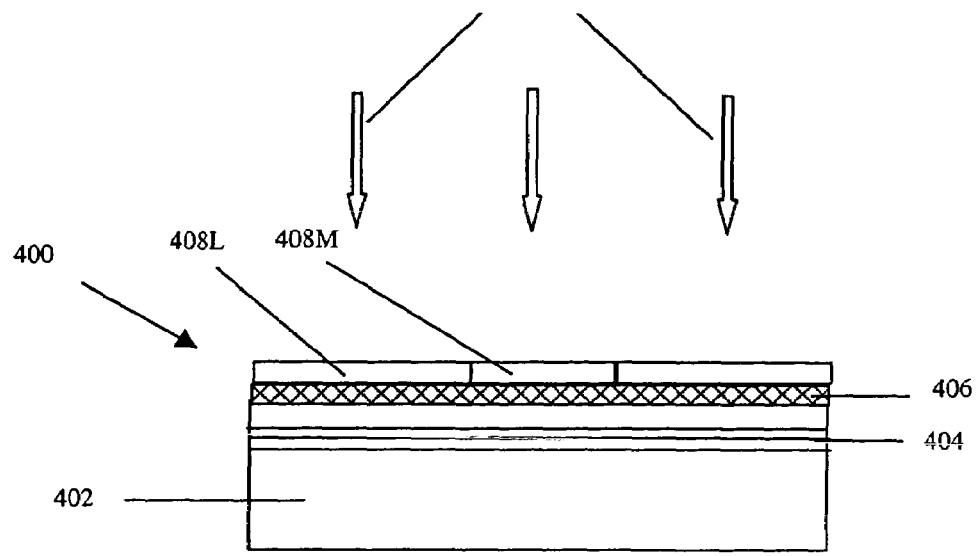
FIG. 4 illustrates a first step in the manufacturing process of forming an asymmetric ridge waveguide on a semiconductor device.

Another approach to fabricating an asymmetric waveguide laser that employs a single mask and a single masking step is described with reference to FIGS. 4–9. FIGS. 4–9 schematically illustrate a device at different stages of fabricating an asymmetric ridge waveguide according to one particular embodiment of a manufacturing method. FIG. 4 illustrates the first step in the manufacturing process of forming an asymmetric ridge waveguide on a semiconductor device 400. The semiconductor device 400 includes a semiconductor substrate 402 with a superstrate layer 404 fabricated, for example, by an epitaxial process such as molecular beam epitaxial (MBE) growth or metal organic chemical vapor deposition (MOCVD). A photoresist layer 406 is deposited on the upper surface of the semiconductor device 400. A three region optical mask having of a left-hand region 408L, a middle region 408M, and a right-hand region 408R may be placed over the photoresist layer 406. The three regions of the optical mask 408L, 408M, and 408R have different optical transmission efficiencies. To form an asymmetric ridge with a greater depth on the right-hand side of the ridge, the right-hand side of the optical mask 408R may have a transmission efficiency near 100%, whereas the left-hand side of the mask 408L may have a transmission efficiency less than 100%. The middle region of the mask 408M typically is optically opaque at the exposure wavelength, with nearly 0% transmission.

The top surface of the semiconductor device 400 may be illuminated with equal intensities of light 410 incident upon all three regions of the optical mask 408L, 408M, and 408R. Sufficient light 410 may be delivered through the mask such that the photoresist under the right-hand side of the mask 408R may be fully exposed while the photoresist under the left-hand region 408L may be only partially exposed. Under these circumstances, the photoresist under the middle region 408M may be effectively unexposed. After delivery of the illumination light 410, the optical mask may be removed.

Figure 5:
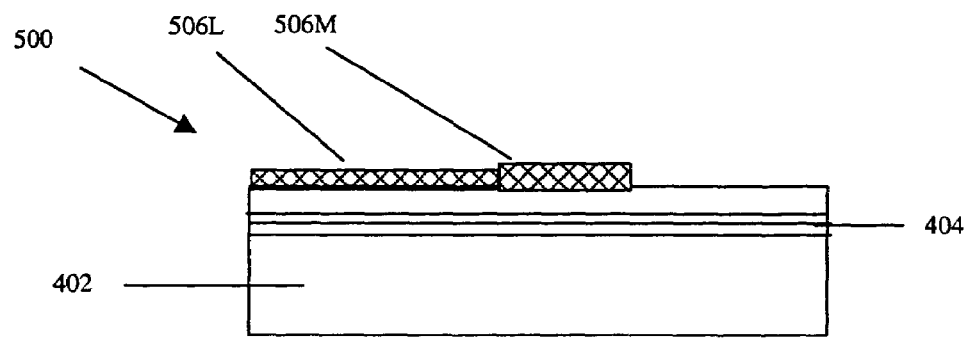
FIG. 5 illustrates a second step in the manufacturing process of forming an asymmetric ridge waveguide on a semiconductor device.

FIG. 5 illustrates the results of the second step in the manufacturing process. In the second step, a developer solution may be applied to the top surface of the semiconductor device 500, which totally removes the photoresist on the top right-hand side of the device 500. The left-hand region of the photoresist 506L is partially removed since it was only partially exposed. The middle portion 506M of the photoresist remains unexposed, and so its thickness is effectively unchanged from its original thickness.

Figure 6:
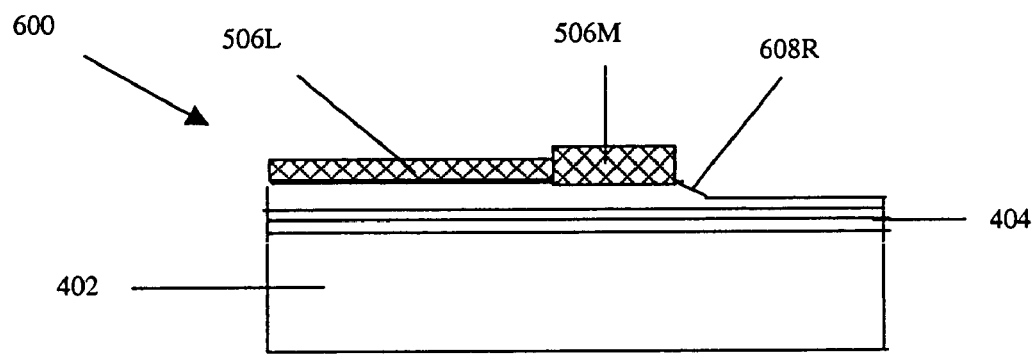
FIG. 6 illustrates a third step in the manufacturing process of forming an asymmetric ridge waveguide on a semiconductor device.

FIG. 6 illustrates the results of the third step in the manufacturing process. A chemical etchant has been applied to the top surface of the device 600 and etching has occurred to form the beginnings of the right-hand side ridge 608R. At this stage, the remaining left-hand 506L and mid-region 506M photoresist has protected the remainder of the top surface from chemical etching.

Figure 7:
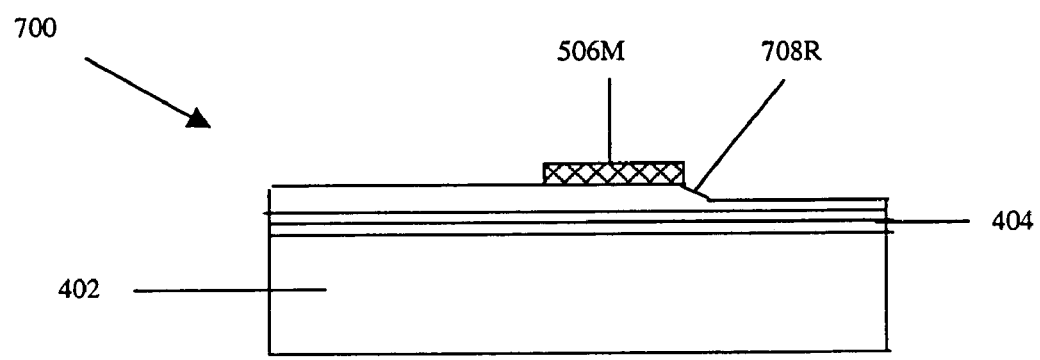
FIG. 7 illustrates a fourth step in the manufacturing process of forming an asymmetric ridge waveguide on a semiconductor device.

FIG. 7 illustrates the results of the fourth step in the manufacturing process. In this step, additional UV light has been delivered to the top surface of the device 700 to fully expose the left-hand region of the photoresist (not shown) and partially expose the mid-region 506M of the photoresist. The top surface is then treated with developer to completely remove the left-hand portion of the photoresist but leave behind a partial thickness of the mid-region photoresist 506M.

Figure 8:
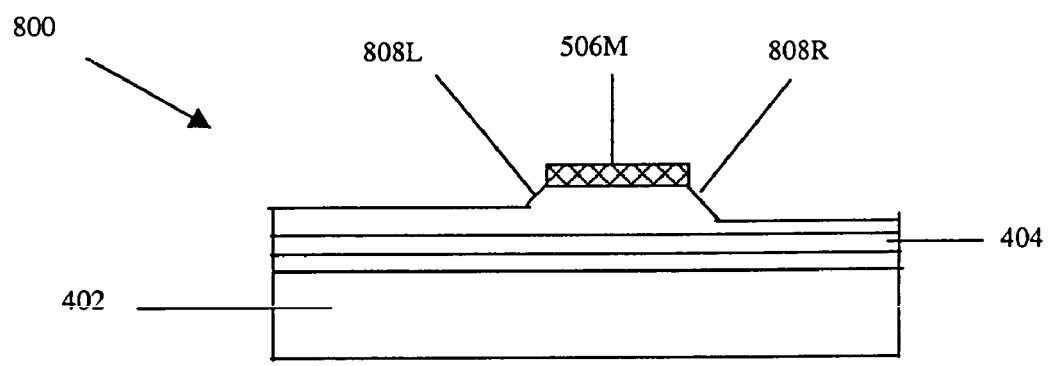
FIG. 8 illustrates a fifth step in the manufacturing process of forming an asymmetric ridge waveguide on a semiconductor device.

FIG. 8 illustrates the results of the fifth step in the manufacturing process. In this step a chemical etchant has been applied to the top surface of the device 800 and etching has occurred to form the final geometry of the left-hand side region 808L and right-hand side region 808R of the asymmetric ridge.

Figure 9:
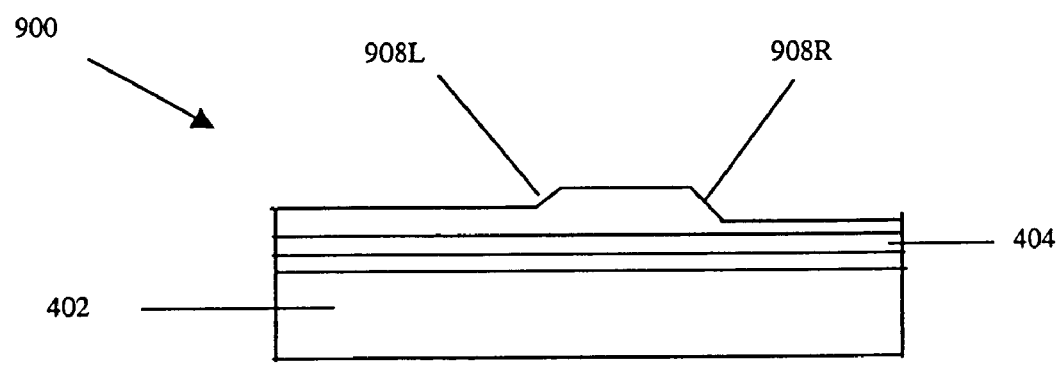
FIG. 9 illustrates a sixth step in the manufacturing process of forming an asymmetric ridge waveguide on a semiconductor device.

FIG. 9 illustrates the results of the sixth and final step in the manufacturing process of forming an asymmetric ridge waveguide on a semiconductor device 900. In this step the remaining photoresist on the middle region is removed by applying a chemical agent such as acetone. The semiconductor device 900 may now undergo additional processing steps to fabricate, for example, bonding pads, bottom-surface metallization and the like.

An advantage of this approach is that a single masking step is required, thus simplifying the manufacturing process of the asymmetric ridge by avoiding the need to align a second mask with a first exposed portion of the semiconductor device.

As noted above, the present invention is applicable to semiconductor devices and is believed to be particularly useful for semiconductor devices with as asymmetric waveguide. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A semiconductor optical device, comprising:
a substrate;
first and second semiconductor side regions formed over the substrate; and
a semiconductor ridge disposed between the first and second side regions and over the substrate forming an optical waveguide within the device, a height of the semiconductor ridge above the substrate being greater than heights of the first and second side regions above the substrate, the height of the first side region above the substrate, at a point along the waveguide, being different from a height of the second side region above the substrate, at the point along the waveguide.

2. A device as recited in claim 1, further comprising an active semiconductor region formed between the ridge and the substrate, the ridge guiding light amplified in the active semiconductor region.

3. A device as recited in claim 1, further comprising an electrode disposed over the ridge to inject current into the ridge.

4. A device as recited in claim 1, wherein the device comprises a semiconductor laser.

5. A device as recited in claim 1, further comprising a frequency selector optically coupled to the active region.

6. A device as recited in claim 5, wherein the frequency selector is a fiber Bragg grating coupled to an optical output from the semiconductor laser.

7. A device as recited in claim 1, wherein the first and second side regions define an average side region height above the substrate, and a kink current of the laser is higher than where the heights of the first and second side regions above the substrate are both equal to the average side region height.

8. A device as recited in claim 1, further comprising a current controller coupled to inject current through the ridge.

9. A device as recited in claim 1, wherein the substrate is thermally coupled to a cooler to remove heat from the substrate.

10. A device as recited in claim 9, wherein the cooler includes a thermoelectric cooler, and further comprising a cooler controller coupled to control operation of the thermoelectric cooler.

11. A device as recited in claim 1, further comprising at least one bond pad disposed on at least one of the first and second side regions, an electrode over the ridge being electrically coupled to the at least one bond pad, and a submount attached to the substrate, the submount being coupled to a laser carrier.

12. An optical communications system, comprising:
an optical transmitter;
a fiber optic link coupled to receive optical signals from the optical transmitter;
an optical receiver coupled to the fiber optic link to receive the optical signals; and
a laser coupled to inject light into the fiber optic link, the laser including
a substrate;
first and second semiconductor side regions formed over the substrate; and
a semiconductor ridge formed between the first and second side regions and over the substrate to introduce an optical waveguide within the device, a height of the semiconductor ridge above the substrate being greater than the heights of the first and second side regions above the substrate, the height of the first side region above the substrate, at a point along the waveguide, being different from a height of the second side region above the substrate, at the point along the waveguide.

13. The system as recited in claim 12, wherein the laser is disposed within the optical transmitter.

14. The system as recited in claim 12, wherein the fiber optic link includes at least one fiber amplifier unit having a length of fiber amplifier, the at least one fiber amplifier unit including the laser coupled to inject pump light into the length of fiber amplifier.

15. The system as recited in claim 12, wherein the laser includes a frequency selector to select an output wavelength of pump light generated by the laser.

16. The system as recited in claim 12, wherein the optical transmitter includes control circuitry to control operation of one or more transmitter lasers within the optical transmitter and one or more respective modulator units to receive incoming information and modulate the incoming information onto light produced by the one or more lasers.

17. The system as recited in claim 12, wherein the optical transmitter includes at least two lasers operating at different wavelengths and a wavelength multiplexing unit to multiplex output light from the at least two lasers into a single output signal.

18. The system as recited in claim 12, wherein the optical receiver includes a wavelength demultiplexing unit to separate the optical signals into components of different wavelength, and respective detectors to detect signals at the different wavelengths.

19. A semiconductor laser, comprising:
a substrate having an upper surface, a lateral direction being defined parallel to the upper substrate surface;
one or more superstrate layers provided on the substrate; and
an optical waveguide disposed over the substrate to guide light passing between ends of the substrate and defining a fundamental optical mode, first and second sides of the optical waveguide providing optical confinement in the lateral direction, the optical confinement for the fundamental optical mode provided on the first side of the optical waveguide being different from the optical confinement provided on the second side of the optical waveguide, the waveguide including a ridge waveguide formed from a semiconductor ridge disposed along the substrate, a depth of the optical waveguide relative to a base of the semiconductor ridge on the first side of the optical waveguide being different from a depth of the optical waveguide relative to the base of the ridge on the second side of the optical waveguide.

20. A laser as recited in claim 19, further comprising an electrode disposed over the ridge to inject current into the ridge.

21. A laser as recited in claim 19, further comprising a frequency selector optically coupled to the optical waveguide.

22. A laser as recited in claim 21, wherein the frequency selector is a fiber Bragg grating coupled to an optical output from the semiconductor laser.

23. A laser as recited in claim 19, wherein the first and second sides of the optical waveguide define an average waveguide confinement, and a kink current of the laser is higher than where the first and second sides of the optical waveguide each provide the average waveguide confinement.

24. A laser as recited in claim 19, further comprising a current controller coupled to inject current through the ridge.

25. A laser as recited in claim 19, wherein the substrate is thermally coupled to a cooler to remove heat from the substrate.

26. A laser as recited in claim 25, wherein the cooler includes a thermoelectric cooler, and further comprising a cooler controller coupled to control operation of the thermoelectric cooler.

27. An optical communications system, comprising:
an optical transmitter;
a fiber optic link coupled to receive optical signals from the optical transmitter;
an optical receiver coupled to the fiber optic link to receive the optical signals; and
a laser coupled to inject light into the fiber optic link, the laser including
a substrate;
one or more superstrate layers provided on the substrate; and
an optical waveguide disposed over the substrate to guide light passing between ends of the substrate and defining a fundamental optical mode, first and second sides of the optical waveguide providing optical confinement in the lateral direction, the optical confinement for the fundamental optical mode provided on the first side of the optical waveguide being different from the optical confinement provided on the second side of the optical waveguide, the waveguide including a ridge waveguide formed from a semiconductor ridge disposed along the substrate, a depth of the optical waveguide relative to a base of the semiconductor ridge on the first side of the optical waveguide being different from a depth of the optical waveguide relative to the base of the ridge on the second side of the optical waveguide.

28. The system as recited in claim 27, wherein the laser is disposed within the optical transmitter.

29. The system as recited in claim 27, wherein the fiber optic link includes at least one fiber amplifier unit having a length of fiber amplifier, the at least one fiber amplifier unit including the laser coupled to inject pump light into the length of fiber amplifier.

30. The system as recited in claim 27, wherein the laser includes a frequency selector to select an output wavelength of pump light generated by the laser.

31. The system as recited in claim 27, wherein the optical transmitter includes control circuitry to control operation of one or more transmitter lasers within the optical transmitter and one or more respective modulator units to receive incoming information and modulate the incoming information onto light produced by the one or more lasers.

32. The system as recited in claim 27, wherein the optical transmitter includes at least two lasers operating at different wavelengths and a wavelength multiplexing unit to multiplex output light from the at least two lasers into a single output signal.

33. The system as recited in claim 27, wherein the optical receiver includes a wavelength demultiplexing unit to separate the optical signals into components of different wavelength, and respective detectors to detect signals at the different wavelengths.

* * * * *